(12) United States Patent
Anderson et al.

(10) Patent No.: US 7,851,353 B2
(45) Date of Patent: Dec. 14, 2010

(54) METHOD OF FORMING A METAL SILICIDE LAYER, DEVICES INCORPORATING METAL SILICIDE LAYERS AND DESIGN STRUCTURES FOR THE DEVICES

(75) Inventors: Felix Patrick Anderson, Colchester, VT (US); Zhong-Xiang He, Essex Junction, VT (US); Thomas Leddy McDevin, Underhill, VT (US); Eric Jeffrey White, Charlotte, VT (US)

(73) Assignee: International Business Machines Corporation, Armonk, NY (US)

( * ) Notice: Subject to any disclaimer, the term of this patent is extended or adjusted under 35 U.S.C. 154(b) by 265 days.

(21) Appl. No.: 12/142,870

(22) Filed: Jun. 20, 2008

(65) Prior Publication Data

US 2009/0317972 A1  Dec. 24, 2009

(51) Int. Cl.
*H01L 21/4763* (2006.01)
(52) U.S. Cl. ............... 438/630; 438/624; 257/E21.585
(58) Field of Classification Search .......... 257/E21.585; 438/624, 630
See application file for complete search history.

(56) References Cited

U.S. PATENT DOCUMENTS

| 6,051,475 | A | 4/2000 | Ho et al. | |
|---|---|---|---|---|
| 6,638,816 | B2 | 10/2003 | Wakabayashi | |
| 6,720,603 | B2 | 4/2004 | Iijima et al. | |
| 7,179,739 | B2 * | 2/2007 | Choi et al. | 438/656 |
| 7,273,779 | B2 | 9/2007 | Fishburn et al. | |
| 7,273,781 | B2 | 9/2007 | Lee | |
| 7,276,751 | B2 | 10/2007 | Ho et al. | |
| 2007/0197032 | A1 * | 8/2007 | Owada et al. | 438/685 |

* cited by examiner

*Primary Examiner*—Thanh V Pham
*Assistant Examiner*—Marvin Payen
(74) *Attorney, Agent, or Firm*—Schmeiser, Olsen & Watts; Anthony J. Canale

(57) ABSTRACT

Methods of forming metal silicide layers. The methods include: forming a silicon-rich layer between dielectric layers; contacting the silicon-rich layer with a metal layer and heating the silicon rich-layer and the metal layer to diffuse metal atoms from the metal layer into the silicon layer to form a metal silicide layer.

10 Claims, 9 Drawing Sheets

METHOD OF FORMING A METAL SILICIDE LAYER, DEVICES INCORPORATING METAL SILICIDE LAYERS AND DESIGN STRUCTURES FOR THE DEVICES

RELATED APPLICATIONS

This application is related to copending U.S. patent application 12/142,896.

FIELD OF THE INVENTION

The present invention relates to the field of integrated circuits; more specifically, it relates a method of forming a metal silicide layer, devices incorporating metal silicide layers and design structures incorporating a metal silicide layers.

BACKGROUND OF THE INVENTION

Integrated circuits utilize devices incorporating metal silicides. For example metal silicides are often used to form contact structures to the source, drain and gate electrode of field effect transistors. However, formation of devices using silicide layers in the wiring layers of integrated circuits has not been practiced, though such devices would be useful. Accordingly, there exists a need in the art to eliminate the deficiencies described hereinabove.

SUMMARY OF THE INVENTION

A first aspect of the present invention is a method, comprising: (a) forming a first dielectric layer on a substrate; (b) forming a dielectric first capping layer on a top surface of the first dielectric layer; (c) forming a silicon-rich layer on a top surface of the first capping layer; (d) forming a dielectric second capping layer on a top surface of the silicon-rich layer; (e) forming a second dielectric layer over the second capping layer; (f) forming a trench through the second dielectric layer and the second capping layer, a region of the top surface of the silicon-rich layer exposed in a bottom of the trench; (g) forming a metal layer on the top surface of the second dielectric layer, the metal layer completely filling the trench; and after (g), (h) converting the silicon-rich layer to an electrically conductive metal silicide layer by heating the metal layer and silicon rich layer to a temperature greater than room temperature to diffuse metal atoms from the metal layer into the silicon-rich layer.

A second aspect of the present invention is a method, comprising: (a) forming a first dielectric layer on a substrate; (b) forming a donor wire in the first dielectric layer, a top surface of the donor wire substantially coplanar with a top surface of the first dielectric layer; (c) forming a dielectric first capping layer on the top surface of the first dielectric layer and the top surface of the donor wire; (d) forming a first trench in the first capping layer, the first trench not extending completely through the first capping layer; (e) forming a second trench through the first capping layer in a region of a bottom of the first trench, the top surface of the donor wire exposed in a bottom of the second trench; (f) forming a silicon-rich layer on a top surface of the first capping layer, the silicon-rich layer discontinuous along a perimeter of the first trench, the silicon rich layer contacting the top surface of the donor wire in the bottom of the second trench; (g) forming a dielectric second capping layer on a top surface of the silicon-rich layer; and after (g), (h) converting the silicon-rich layer only in the second trench to an electrically conductive metal silicide layer by heating the donor wire and silicon rich layer to a temperature greater than room temperature to diffuse metal atoms from the donor wire into the silicon-rich layer.

BRIEF DESCRIPTION OF THE DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

Figure 1A:
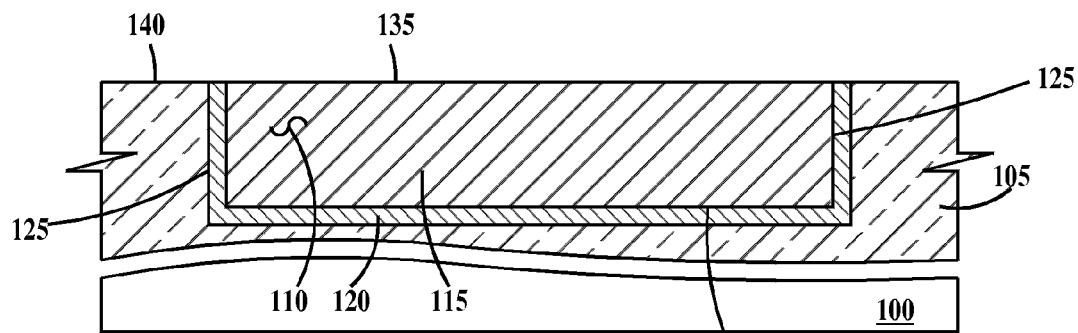
FIGS. 1A through 1I are cross-sectional drawings illustrating formation of a silicide layer and a capacitor according to a first embodiment of present invention.

FIGS. 1A through 1I are cross-sectional drawings illustrating formation of a silicide layer and a capacitor according to a first embodiment of present invention. In FIG. 1A, formed on a substrate 100 is a dielectric layer 105. Formed in dielectric layer 105 is a wire 110. Wire 110 comprises a core conductor 115 and an optional electrically conductive liner 120 formed on sidewalls 125 and a bottom surface 130 of wire 110. A top surface 135 of wire 110 is substantially coplanar with a top surface 140 of dielectric layer 105. In the example of FIG. 1A, wire 110 is a damascene formed by a damascene process (or dual damascene formed by a dual damascene process) wire.

A damascene process is one in which wire trenches or via openings are formed in a dielectric layer, an electrical conductor of sufficient thickness to fill the trenches is deposited on a top surface of the dielectric, and a chemical-mechanical-polish (CMP) process is performed to remove excess conductor and make the surface of the conductor co-planar with the surface of the dielectric layer to form damascene wires (or damascene vias). When only a trench and a wire (or a via opening and a via) is formed the process is called single-damascene.

A dual-damascene process is one in which via openings are formed through the entire thickness of a dielectric layer followed by formation of trenches part of the way through the dielectric layer in any given cross-sectional view. All via openings are intersected by integral wire trenches above and by a wire trench below, but not all trenches need intersect a via opening. An electrical conductor of sufficient thickness to fill the trenches and via opening is deposited on a top surface of the dielectric and a CMP process is performed to make the surface of the conductor in the trench co-planar with the surface the dielectric layer to form dual-damascene wires and dual-damascene wires having integral dual-damascene vias.

In one example substrate 100 comprises a bulk silicon substrate or a silicon-on-insulator (SOI) substrate in which electronic devices such a transistors, diodes and capacitors have been formed as parts of an integrated circuit. In one example, dielectric layer 105 is an interlevel dielectric layer (ILD) of one of at least two wiring levels used to wire the devices of substrate 100 into integrated circuits. In one example core conductor 120 is aluminum. In one example core conductor 120 is copper. In one example liner 120 comprises a layer of titanium on a layer of titanium nitride, the titanium nitride abutting dielectric layer 105, the titanium abutting core conductor 115. In one example liner 120 comprises a layer of tantalum on a layer of tantalum nitride, the tantalum nitride abutting dielectric layer 105, the tantalum abutting core conductor 115. In one example, dielectric layer 105 is a silicon oxide formed by chemical vapor deposition.

Figure 1B:
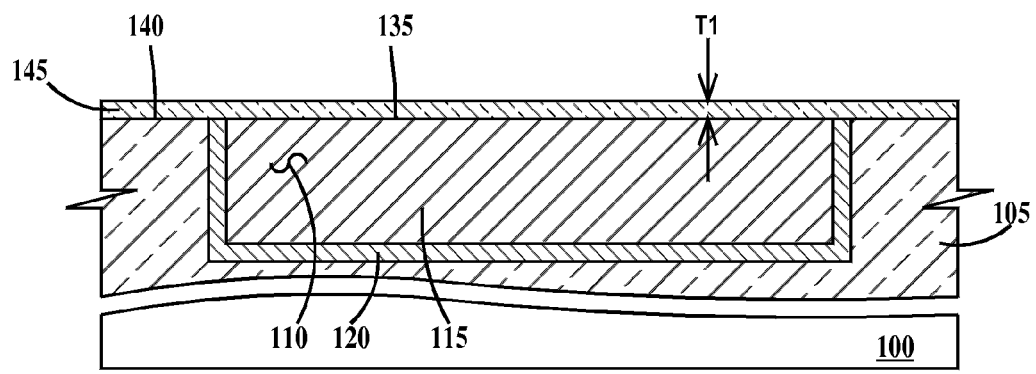

In FIG. 1B, a first capping layer 145 is formed on top surface 135 of wire 110 and top surface 140 of dielectric layer 105. First capping layer 145 has a thickness T1. In one example, first capping layer 145 is silicon nitride. In one example capping layer 145 is formed by plasma enhanced chemical-vapor-deposition (PECVD). In one example, T1 is between about 35 nm and about 75 nm.

Figure 1C:
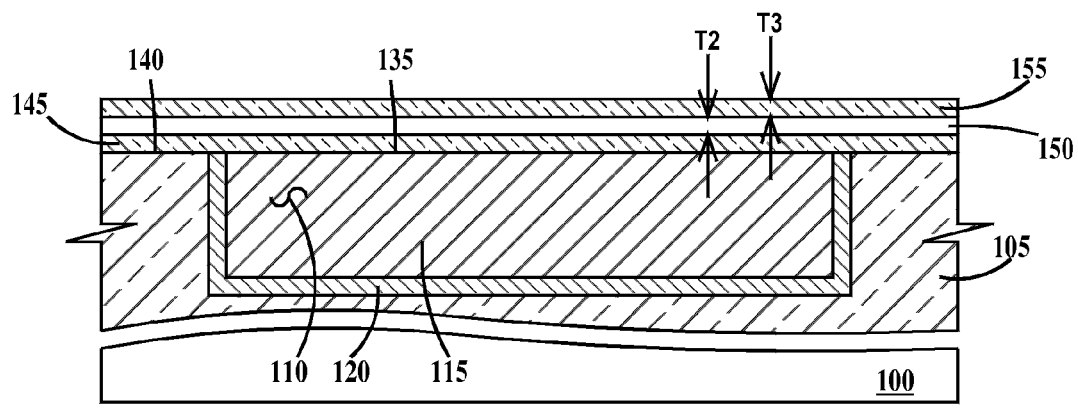

In FIG. 1C, a silicon-rich layer 150 is formed on first capping layer 145 and a second capping layer 155 is formed on silicon-rich layer 150. Silicon-rich layer 150 has a thickness T2. Second capping layer 155 has a thickness T3. In one example, silicon-rich layer 150 is polysilicon. In one example, silicon-rich layer 150 is silicon-rich silicon nitride. Stochiometric silicon nitride ($Si_3N_4$) is about 43 atom % silicon (100 times 3/7). Silicon-rich silicon nitride is defined as silicon nitride containing at least 48 atom % silicon. In one example, silicon-rich layer 150 comprises silicon-rich nitride containing between about 48 atom % and about 85% atom percent silicon. In one example polysilicon may be formed by PECVD using $SiH_4$. In one example silicon nitride and silicon-rich nitride may be formed by PECVD using a mixture of $SiH_4$ and $H_2O$, $NH_3$, $N_2$ and combinations thereof. When silicon-rich layer 150 is silicon-rich silicon nitride and capping layer 155 is silicon nitride, both layers may be formed in situ in the same process chamber by varying the gas mixtures at different stages of the deposition process. In one example, T2 is between about 5 nm and about 100 nm. In one example. T3 is between about 20 nm and about 100 nm.

Figure 1D:
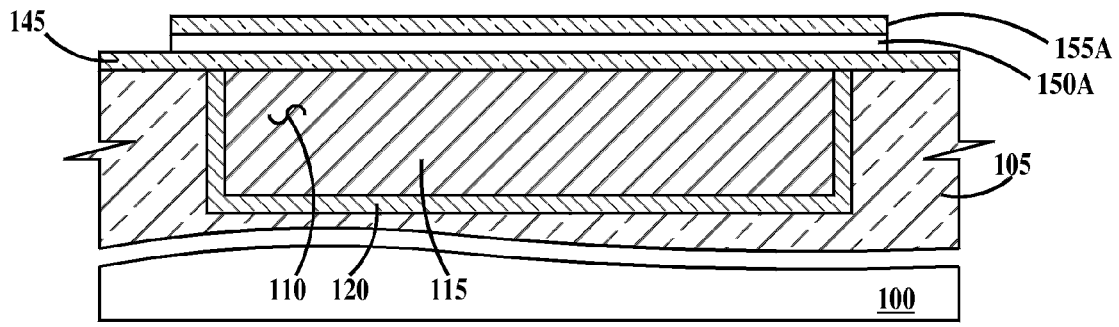

In FIG. 1D, a photolithographic/etch process has been performed to pattern silicon-rich layer 150 and second capping layer 155 (see FIG. 1C) form block comprising a silicon-rich layer 150A having a coextensive capping layer 155A, silicon-rich layer 150A and capping layer 155A not completely covering first capping layer 145. A photolithographic/etch process is one in which a photoresist layer is formed on a base layer, the photoresist layer exposed to actinic radiation through a patterned photomask and then the photoresist layer is developed to form a patterned photoresist layer. For a positive photoresist the exposed regions are developed away, for a negative resist the unexposed regions are developed away. An etch processes is then performed to remove the base layer where the base layer is not protected by the patterned photoresist layer and then the patterned photoresist layer is removed.

Figure 1E:
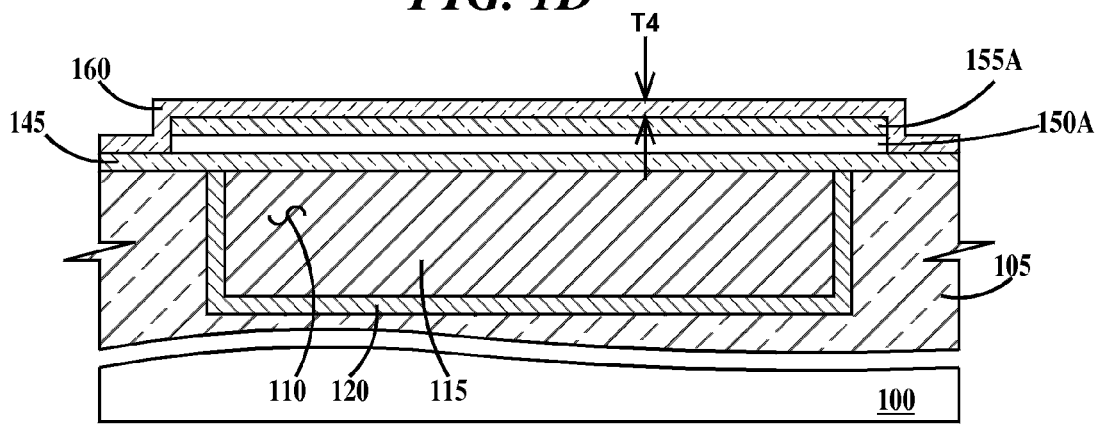

In FIG. 1E, an optional third capping layer 160 is formed on first capping layer 155A and exposed regions of first capping layer 145. Third capping layer 160 has a thickness T4. In one example, third capping layer 160 is silicon nitride. In one example, third capping layer 160 is formed by plasma PECVD. In one example, T4 is between about 20 nm and about 100 nm.

Figure 1F:
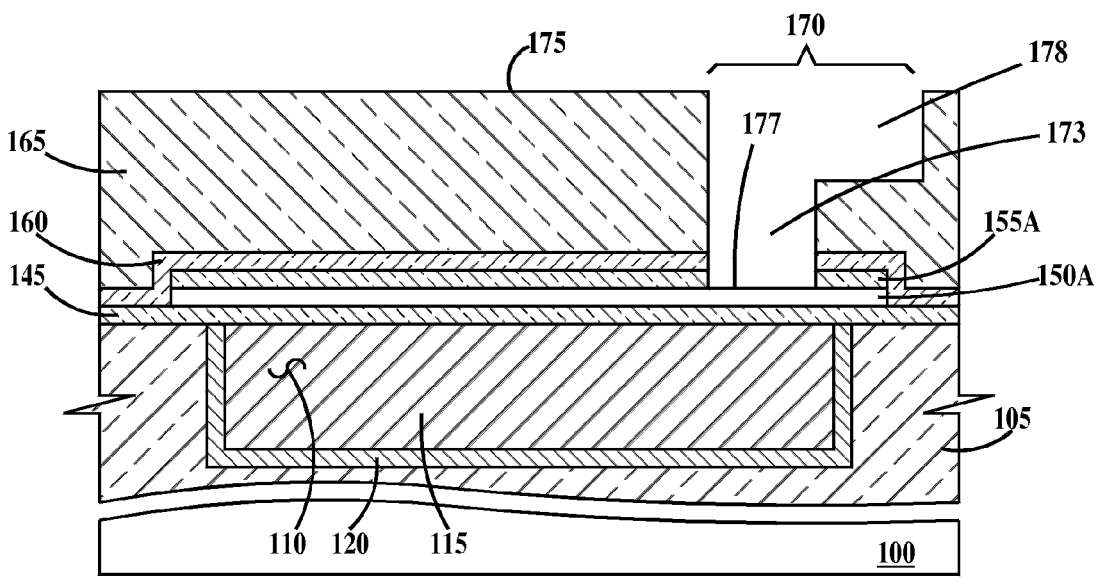

In FIG. 1F, a dielectric layer 165 is formed on third capping layer 160 (or on first capping layer 155A and exposed regions of first capping layer 145 if third capping layer 160 is not present). A trench 170 is formed through dielectric layer 165, through third capping layer 160 (if present) and through second capping layer 155A. A first region 173 of trench 170 extends from a top surface 175 of dielectric layer 165 to a top surface 177 of silicon-rich layer 150A. A second and optional region 178 of trench 170 does not extend completely through dielectric layer 165.

Figure 1G:
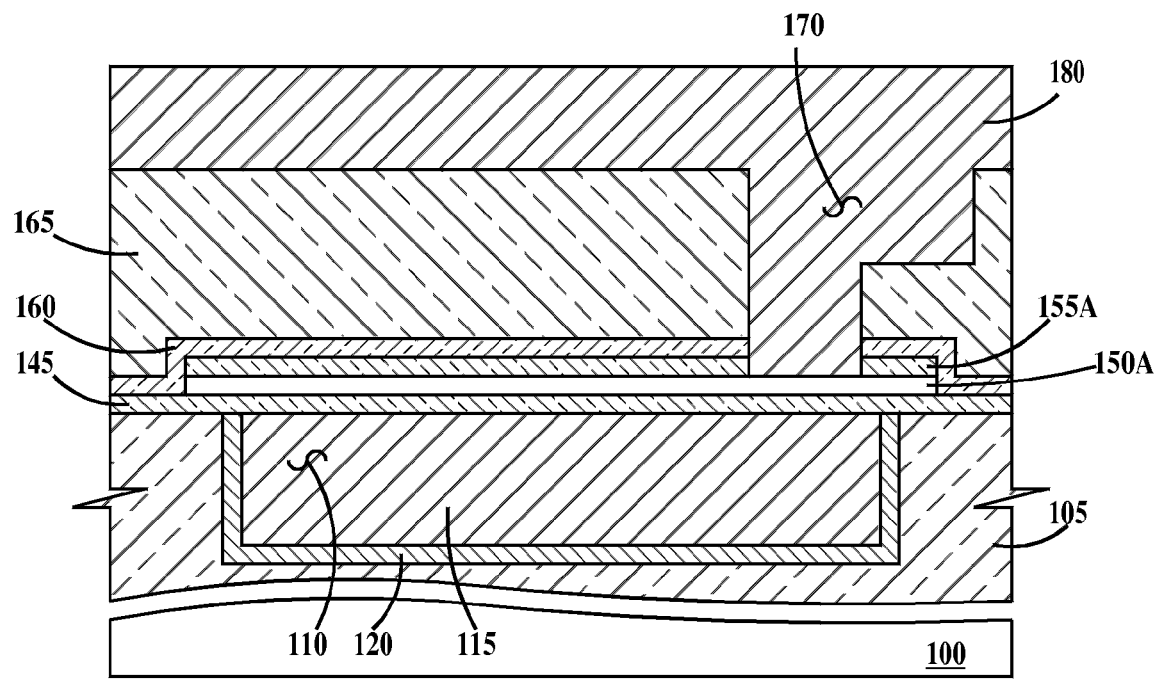

In FIG. 1G, a metal layer 180 is formed on dielectric layer 165. Metal layer 180 completely fills (overfills) trench 170. In one example, metal layer 180 comprises aluminum. In one example, metal layer 180 comprises copper. In one example, metal layer 180 is formed by evaporative deposition or by sputter deposition. In one example, metal layer 180 is formed by electro-chemical plating. Copper is conveniently formed by electro-chemical plating (after a thin copper seed layer is first blanket deposited). Aluminum is conveniently formed by evaporative deposition or by sputter deposition. When metal layer 180 comprises aluminum, it is advantageous that the metal layer does not contain silicon. When metal layer 180 comprises aluminum it may contain up to about 10% by weight copper.

Figure 1H:
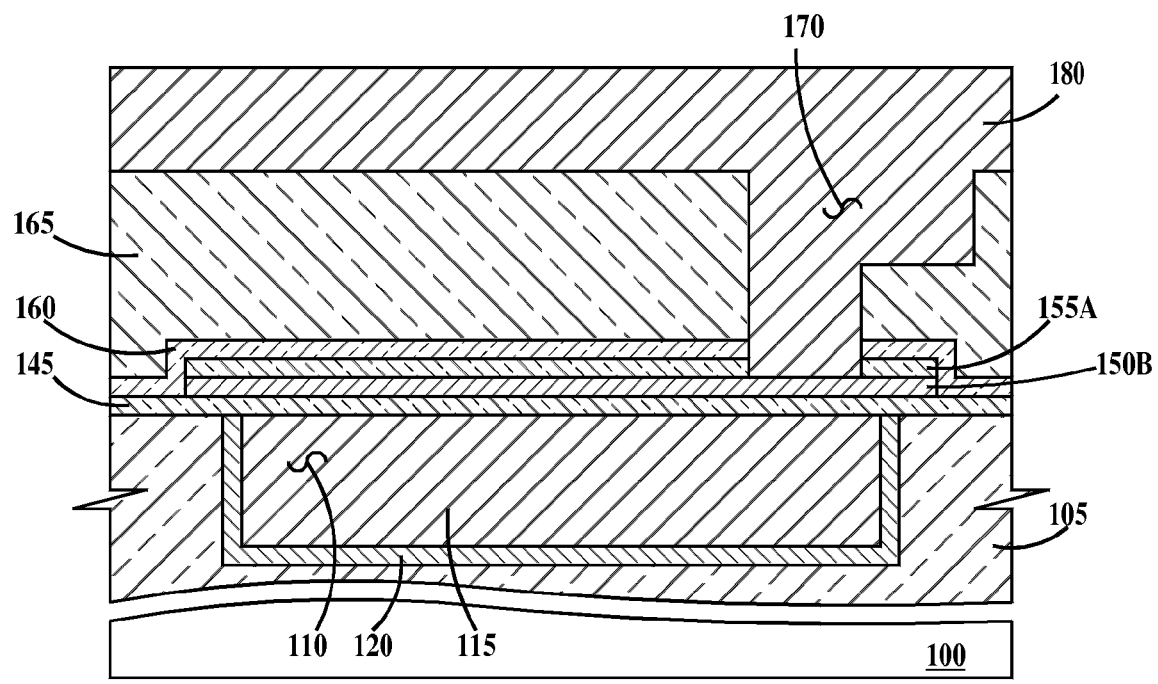

In FIG. 1H, an anneal (i.e., heating to a temperature greater than room temperature, where room temperature is defined as 20° C.) is performed to cause metal atoms from metal layer 180 to diffuse into silicon-rich layer 150A (see FIG. 1G) to convert the silicon-rich layer into an electrically conductive metal silicide layer 150B. For copper, in one example, the anneal is performed between about 200° C. and about 425° C. For aluminum, in one example, the anneal is performed between about 500° C. and about 700° C. It should be understood that copper and aluminum atoms will diffuse through silicon, but that silicon will not diffuse through copper or aluminum. It should also be understood that when metal silicide layer 150B is fabricated from silicon-rich silicon nitride it will contain nitrogen atoms.

Figure 1I:
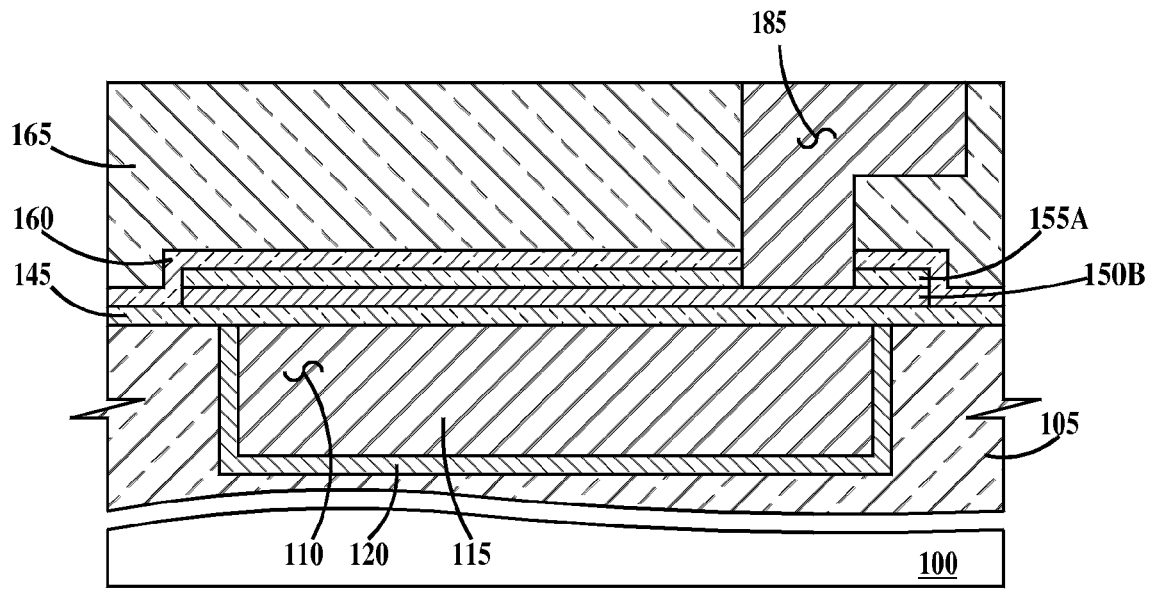

In FIG. 1I, a CMP has been performed to form a dual-damascene wire 185 in dielectric layer 165. Wire 165 is in electrical contact with metal silicide layer 150B. A plate capacitor has thus been formed. Wire 110 forms the first plate of the capacitor, first capping layer 145 forms the insulator of the capacitor and metal silicide layer 150B forms the second plate of the capacitor. Wire 185 provides an electrical connection to the second plate of the capacitor.

It should be understood that other wires similar to wire 110 may be formed in dielectric layer 105 in order to interconnect with wires in other wiring levels and to wire the devices of substrate 100 (and the capacitor just formed) into an integrated circuit. The additional wires in dielectric layers 105 may be formed simultaneously with wire 110. It should be further understood that additional wires similar to wire 185 may be formed in dielectric layer 165 in order to interconnect with wires in other wiring levels and to wire the devices of substrate 100 (and the capacitor just formed) into the integrated circuit. The additional wires in dielectric layers 165 may be formed simultaneously with wire 185.

Figure 2:
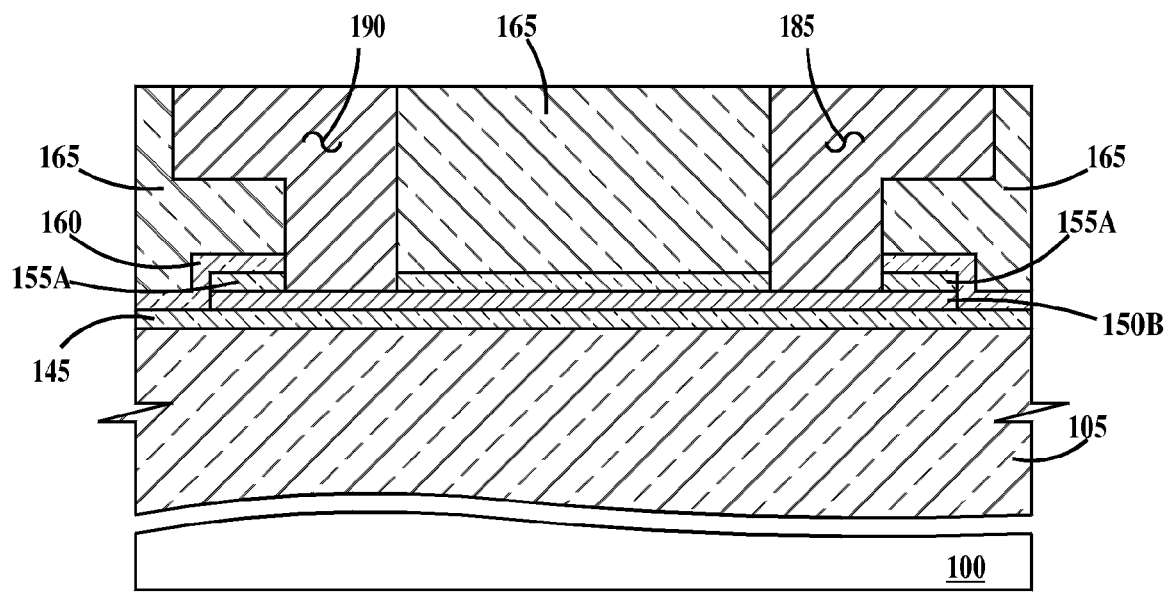
FIG. 2 is a cross-sectional drawing illustrating a resistor according to the first embodiment of present invention.

FIG. 2 is a cross-sectional drawing illustrating a resistor according to the first embodiment of present invention. The method described supra for forming a capacitor can be adapted to form a resistor as well. Wire 110 would not be present in FIGS. 1A through 1I and in FIG. 1F, a second trench similar to trench 170 would be formed to a different region of silicon-rich layer 150A so structure illustrated in FIG. 2 would result. In FIG. 2, the resistor comprises metal silicide layer 150B. Wires 185 and 190 provide electrical connects to opposite ends of the resistor. Wires 185 and 190 would be formed simultaneously.

It should be understood that wires similar to wire 110 of FIG. 1I may be formed in dielectric layer 105 as part of the wiring of the integrated circuit. It should be understood that additional wires similar to wire 185 may be formed in dielectric layer 165 in order to interconnect with wires in other wiring levels and to wire the devices of substrate 100 (and the resistor of FIG. 2) into the integrated circuit. The additional wires in dielectric layer 165 may be formed simultaneously with wire 185.

Figure 3A:
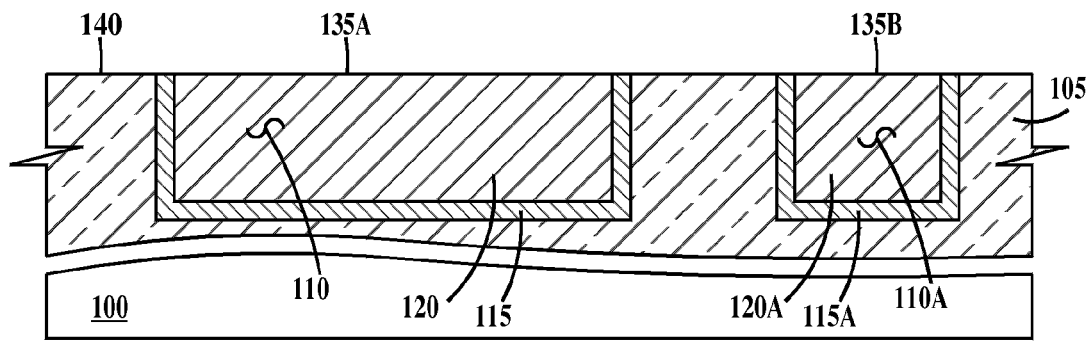
FIGS. 3A through 3I are cross-sectional drawings illustrating formation of a silicide layer and a capacitor according to a second embodiment of present invention.

FIGS. 3A through 3I are cross-sectional drawings illustrating formation of a silicide layer and a capacitor according to a second embodiment of present invention. FIG. 3A is similar to FIG. 1A except an additional wire 110A is formed in dielectric layer 105. Wire 110A is similar to wire 110 and comprises a core conductor 115A and an optional electrically conductive liner 120A. Wire 110A comprises the same materials as describes supra for wire 110. Wires 110 and 110A are advantageously formed simultaneously and comprise the same materials. A top surface 135A of wire 110A is substantially coplanar with top surface 140 of dielectric layer 105. In the example of FIG. 3A, wire 110A is a damascene formed by a damascene process (or dual damascene formed by a dual damascene process) wire.

Figure 3B:
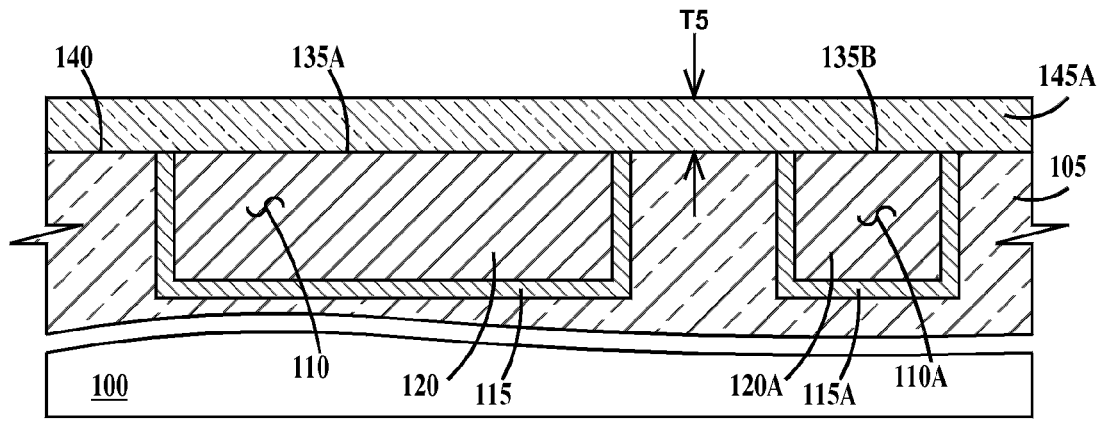

In FIG. 3B, a first capping layer 145A is formed on top surface 135 of wire 110, top surface 135A of wire 110A and top surface 140 of dielectric layer 105. First capping layer 145A has a thickness T5. In one example, first capping layer 145A is silicon nitride. In one example capping layer 145 is formed by plasma enhanced CVD (PECVD). In one example, T5 is between about 50 nm and about 200 nm.

Figure 3C:
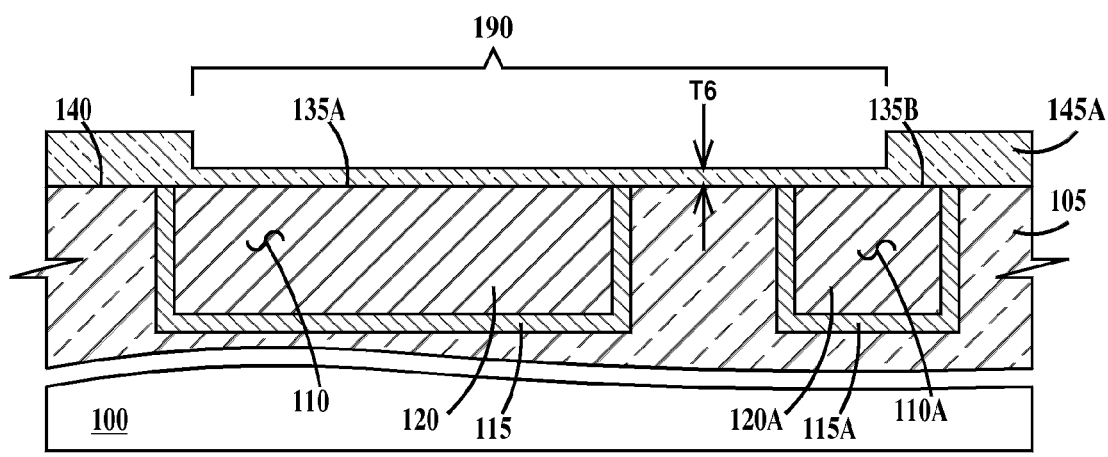

In FIG. 3C, a first trench 190 is etched into first capping layer 145A. The thickness of first capping layer 145A in the bottom of trench 190 is T6. In one example, T6 is between about 35 nm and about 100 nm.

Figure 3D:
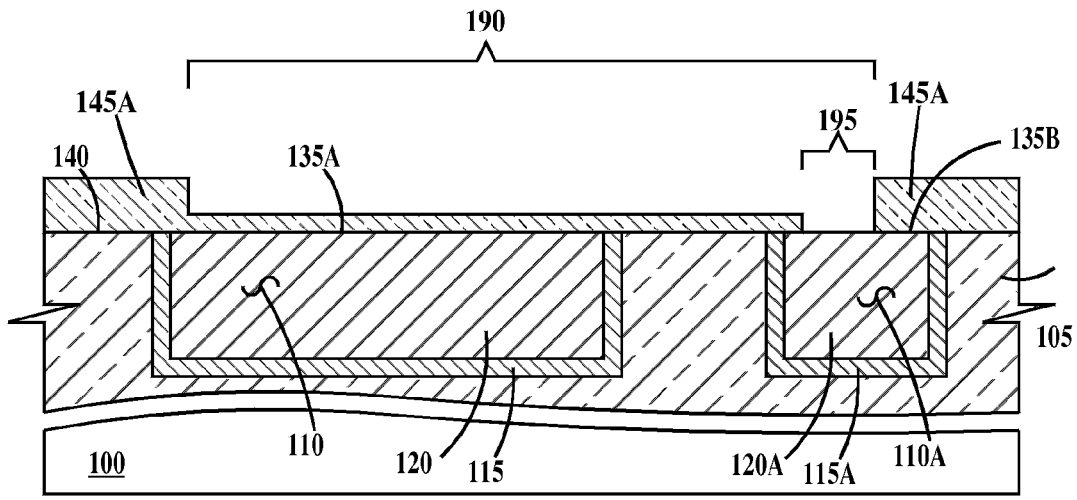

In FIG. 3D, a second trench 195 is etched through the thinned region of first capping layer 145A within trench 195 to expose core conductor 120A of wire 110A.

Figure 3E:
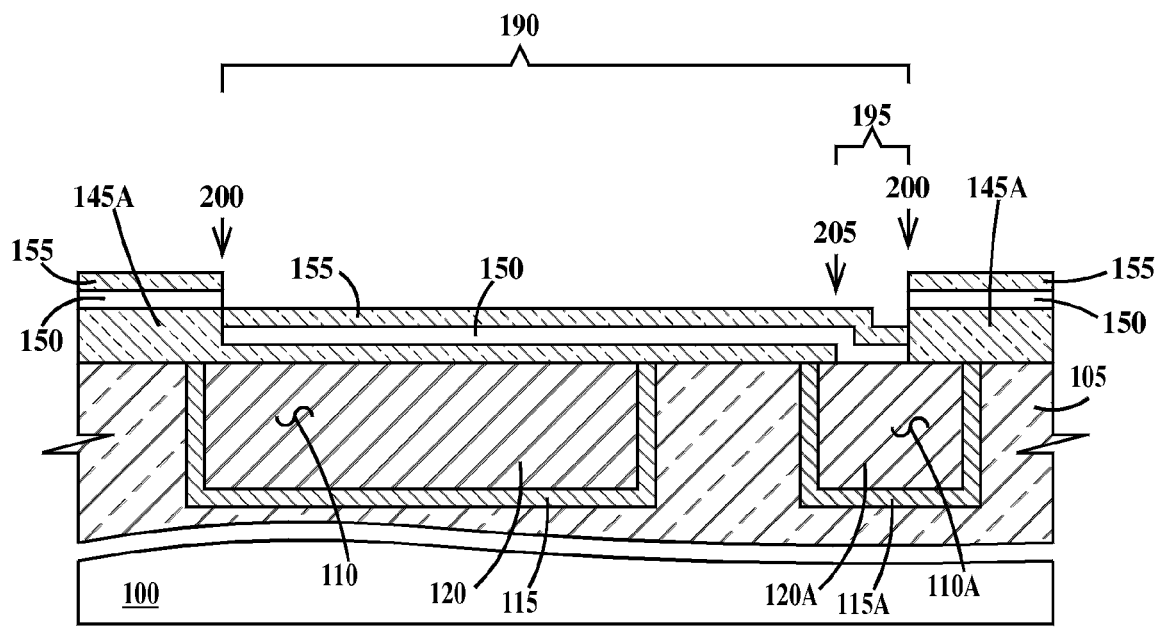

In FIG. 3E, silicon-rich layer 150 (described supra) is formed on first capping layer 145A and second capping layer 155 (described supra) is formed on silicon-rich layer 150. Note that over edges 200 of trench 190 there is a discontinuity or break in silicon-rich layer 150 and second capping layer 155 and there is not a discontinuity over edge 205 of second trench 205. Second capping layer 155 may be thicker than illustrated in FIG. 3E.

In FIG. 1F a dielectric layer 165 is formed on third capping layer 160 (or on first capping layer 155A and exposed regions of first capping layer 145 if third capping layer 160 is not present). A trench 170 is formed through dielectric layer 165, through third capping layer 160 (if present) and through second capping layer 155A. A first region of trench 170 extends from a top surface 175 of dielectric layer 165 to a top surface 177 of silicon-rich layer 150A. A second and optional region 178 of trench 170 does not extend completely through dielectric layer 165.

Figure 3F:
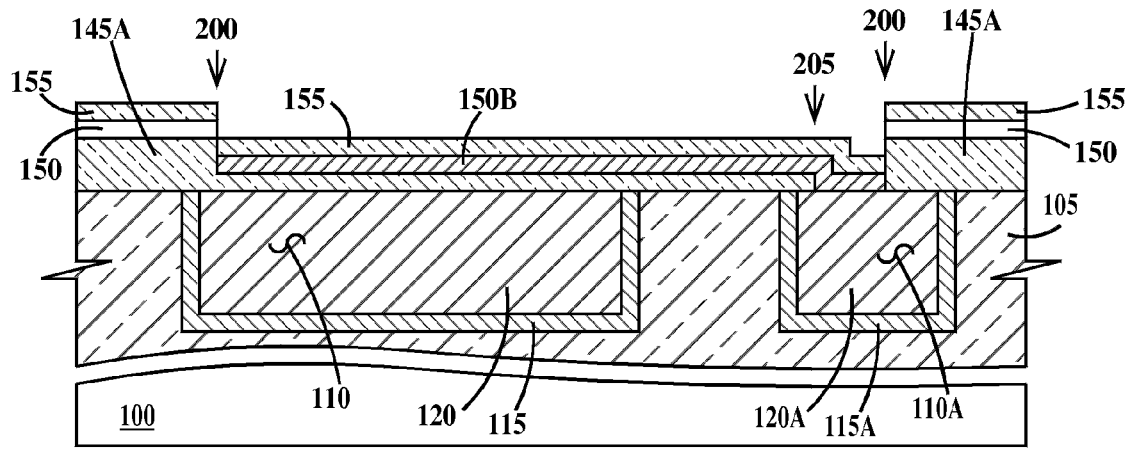

In FIG. 3F, an anneal (i.e., heating above room temperature) is performed to cause metal atoms from metal layer core conductor 120A of wire 110A to diffuse into silicon-rich layer 150 (see FIG. 3E) to convert the silicon-rich layer into electrically conductive metal silicide layer 150B as described supra. For copper, the anneal is performed between about 200° C. and about 426° C. For aluminum, the anneal is performed between about 500° C. and about 700° C. Thus wire 110A may be considered a donor wire and more specifically core conductor 120A of wire 110A may be considered a metal atom source.

Figure 3G:
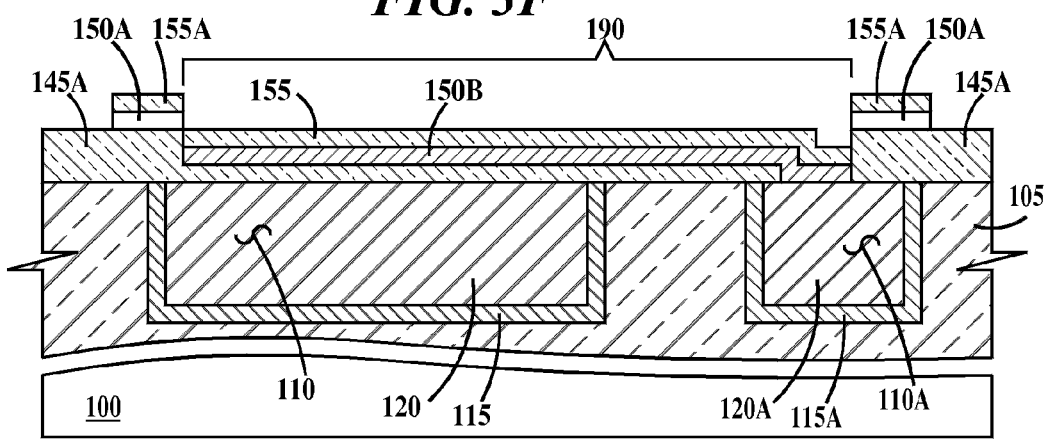
Figure 3H:
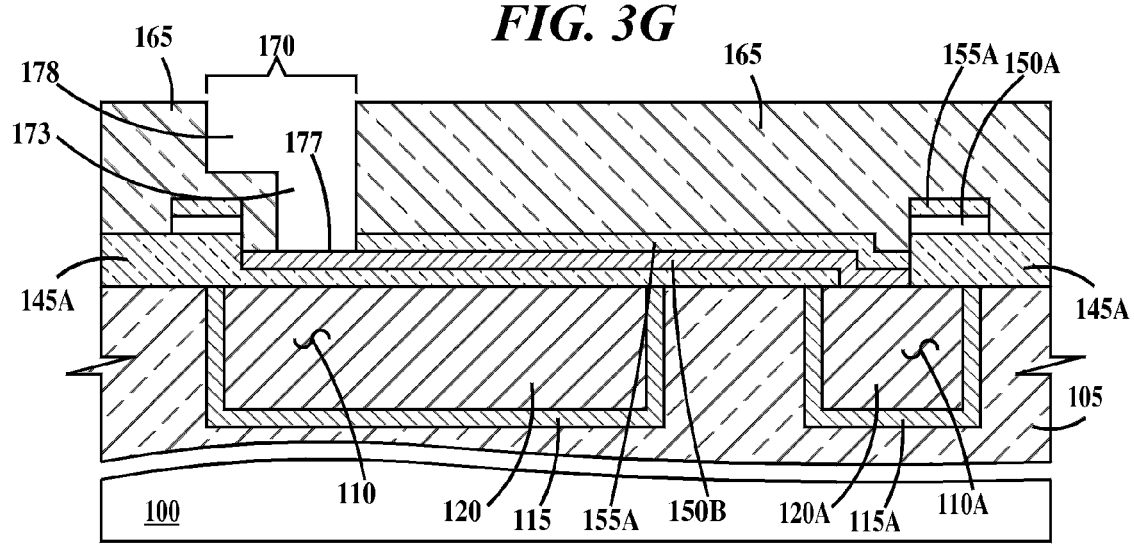

In FIG. 3H, a photolithographic/etch process has been performed to pattern silicon-rich layer 150 and second capping layer 155 (see FIG. 1C) form a silicon-rich layer 150A having a coextensive capping layer 155A.

In FIG. 3F, dielectric layer 165 is formed as described supra, and trench 170 is formed through dielectric layer 165 and second capping layer 155. A first region of trench 170 extends from a top surface 175 of dielectric layer 165 to a top surface 177 of silicon-rich layer 150B. A second and optional region 178 of trench 170 does not extend completely through dielectric layer 165.

In FIG. 3G, regions of silicon-rich layer 150 and second capping layer 150 (see FIG. 3F) are photolithographically defined and removed to form a ring comprising remaining silicon-rich layer 150A and coextensive remaining second capping layer 155A around trench 190.

In FIG. 3H, dielectric layer 165 is formed on second capping layer 155/155A and on first capping layer 145A where the first capping layer is not covered by the second capping layer. Trench 170 is formed through dielectric layer 165 and through second capping layer 155A. A first region 173 of trench 170 extends from a top surface 175 of dielectric layer 165 to a top surface 177 of silicon-rich layer 150A. A second and optional region 178 of trench 170 does not extend completely through dielectric layer 165.

Figure 3I:
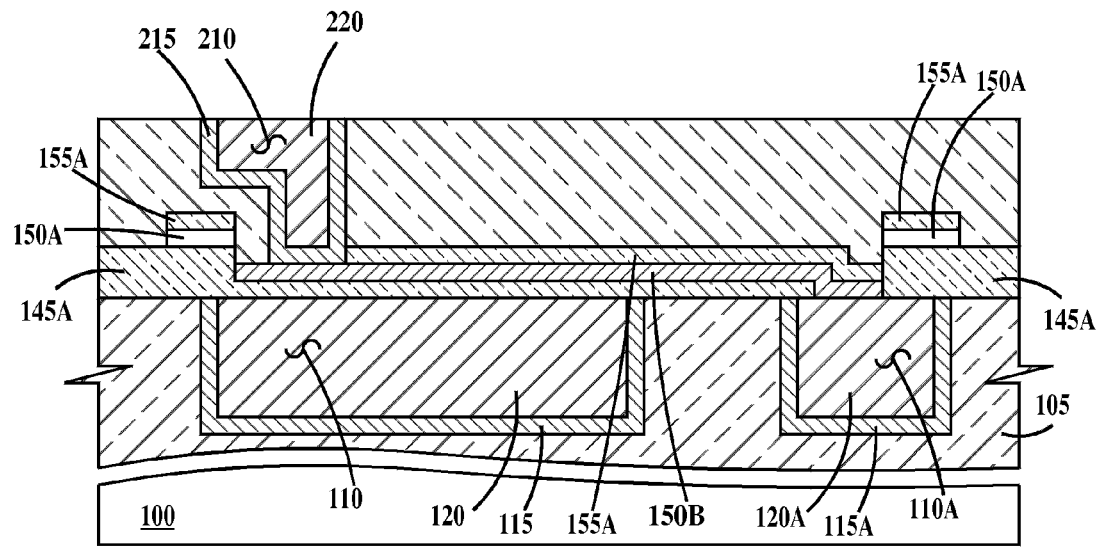

In FIG. 3I, a dual damascene wire 210 comprising a core conductor a liner 215 and a core conductor 220 is formed in trench 170 (see FIG. 3G). In one example core conductor 220 is aluminum. In one example core conductor 220 is copper. In one example liner 220 comprises a layer of titanium on a layer of titanium nitride, the titanium nitride abutting dielectric layer 165, the titanium abutting core conductor 215. In one example liner 220 comprises a layer of tantalum on a layer of tantalum nitride, the tantalum nitride abutting dielectric layer 165, the tantalum abutting core conductor 215.

It should be understood that other wires similar to wire 110 may be formed in dielectric layer 105 in order to interconnect with wires in other wiring levels and to wire the devices of substrate 100 (and the capacitor just formed) into an integrated circuit. The additional wires in dielectric layers 105 may be formed simultaneously with wire 110. It should be further understood that additional wires similar to wire 210 may be formed in dielectric layer 165 in order to interconnect with wires in other wiring levels and to wire the devices of substrate 100 (and the capacitor just formed) into the integrated circuit. The additional wires in dielectric layers 165 may be formed simultaneously with wire 210.

Figure 4:
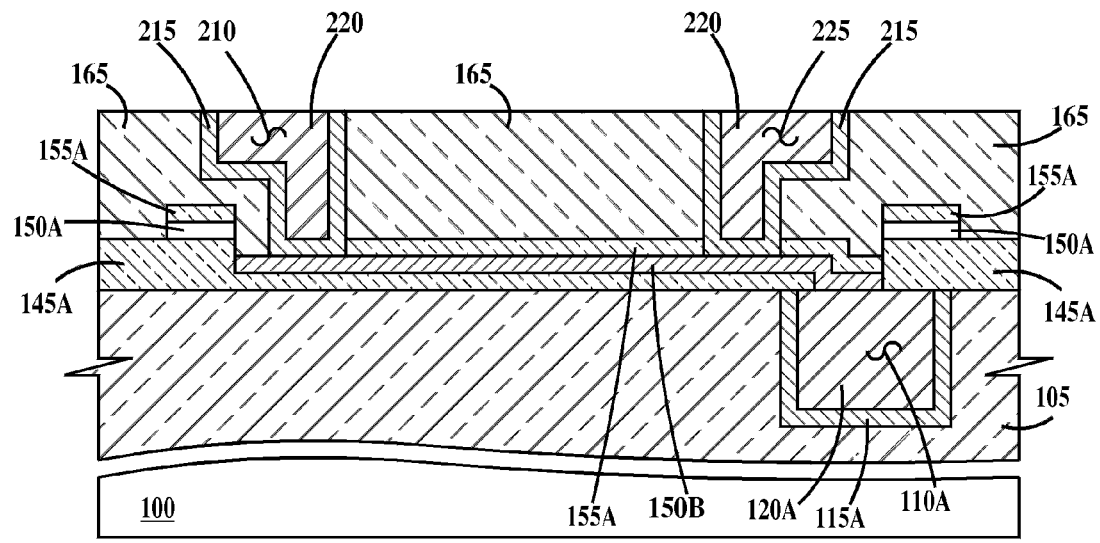
FIG. 4 is a cross-sectional drawing illustrating a resistor according to the second embodiment of present invention.

FIG. 4 is a cross-sectional drawing illustrating a resistor according to the second embodiment of present invention. The method described supra for forming a capacitor can be adapted to form a resistor as well. Wire 110 would not be present (wire 110A would be present) in FIGS. 1A through 1I and in FIG. 1F, a second trench similar to trench 170 would be formed to a different region of silicon-rich layer 150A to provide for a wire 225 so structure illustrated in FIG. 2 would result. In FIG. 2, the resistor comprises metal silicide layer 150B. Wires 210 and 225 provide electrical connects to opposite ends of the resistor. Wires 210 and 225 would be formed simultaneously.

It should be understood that wires similar to wire 110 of FIG. 1I may be formed in dielectric layer 105 as part of the wiring of the integrated circuit. It should be understood that additional wires similar to wire 210 may be formed in dielectric layer 165 in order to interconnect with wires in other wiring levels and to wire the devices of substrate 100 (and the resistor of FIG. 2) into the integrated circuit. The additional wires in dielectric layer 165 may be formed simultaneously with wires 210 and 225.

Figure 5:
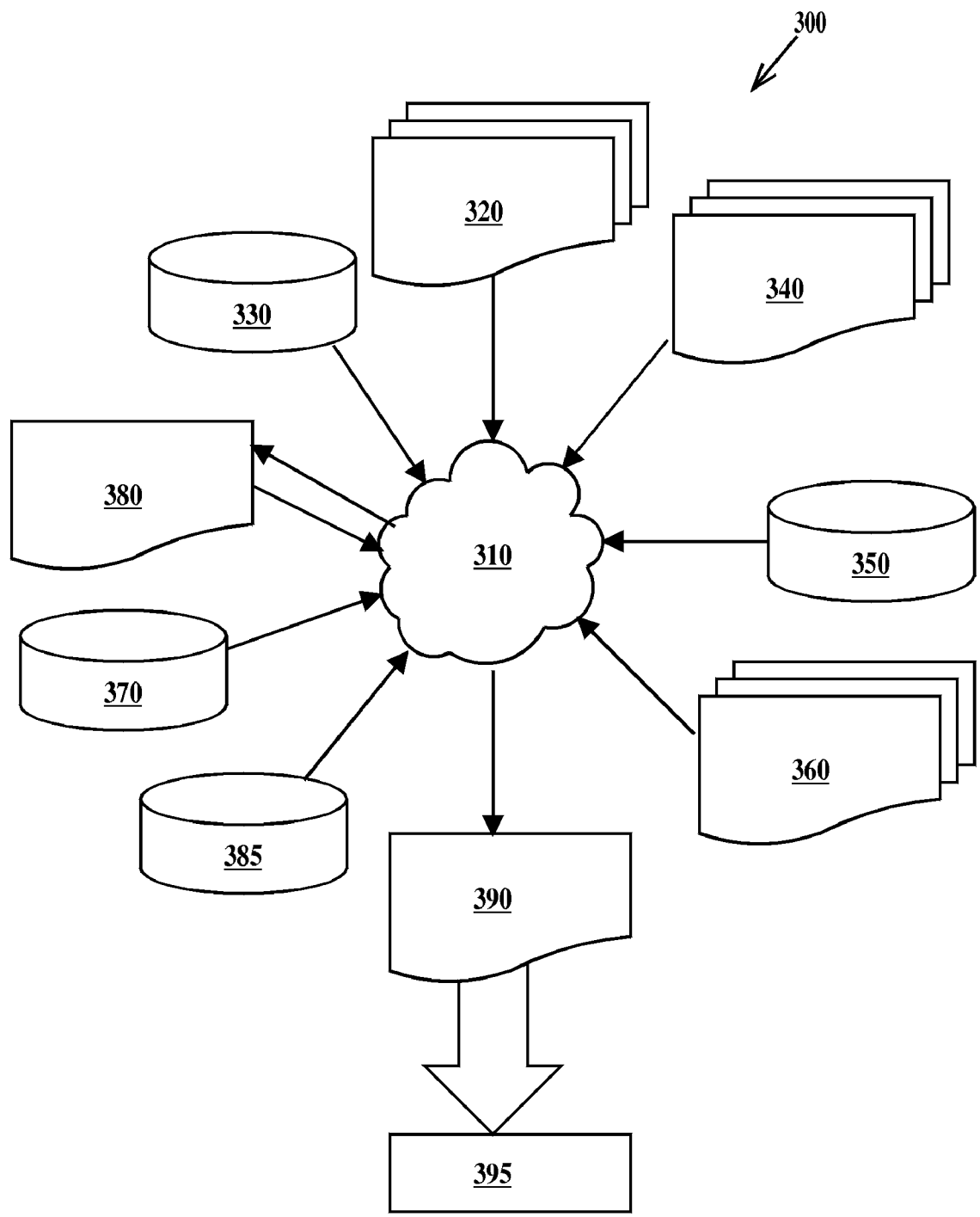
FIG. 5 shows a block diagram of an exemplary design flow 300 used for example, in semiconductor design, manufacturing, and/or test.

FIG. 5 shows a block diagram of an exemplary design flow 300 used for example, in semiconductor IC logic design, simulation, test, layout, and manufacture. Design flow 300 includes processes and mechanisms for processing design structures or devices to generate logically or otherwise functionally equivalent representations of the design structures and/or devices described above and shown in FIGS. 1I, 2, 3I and 4. The design structures processed and/or generated by design flow 300 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Design flow 300 may vary depending on the type of representation being designed. For example, a design flow 300 for building an application specific IC (ASIC) may differ from a design flow 300 for designing a standard component or from a design flow 300 for instantiating the design into a programmable array, for example a programmable gate array (PGA) or a field programmable gate array (FPGA) offered by Altera® Inc. or Xilinx® Inc.

FIG. 5 illustrates multiple such design structures including an input design structure 320 that is preferably processed by a design process 310. In one embodiment, the design structure 320 comprises design data used in a design process and comprising information describing an embodiment of the invention with respect to resistors and capacitors and other devices as shown in FIGS. 1I, 2, 3I and 4. The design data in the form of schematics or HDL, a hardware-description language (e.g., Verilog, VHDL, C, etc.) may be embodied on one or more machine readable media. For example, design structure 320 may be a text file, numerical data or a graphical representation of an embodiment of the invention as shown in FIGS. 1I, 2, 3I and 4. Design structure 320 may be a logical simulation design structure generated and processed by design process 310 to produce a logically equivalent functional representation of a hardware device. Design structure 320 may also or alternatively comprise data and/or program instructions that when processed by design process 310, generate a functional representation of the physical structure of a hardware device. Whether representing functional and/or structural design features, design structure 320 may be generated using electronic computer-aided design (ECAD) such as implemented by a core developer/designer. When encoded on a machine-readable data transmission, gate array, or storage medium, design structure 320 may be accessed and processed by one or more hardware and/or software modules within design process 310 to simulate or otherwise functionally represent an electronic component, circuit, electronic or logic module, apparatus, device, or system such as those shown in FIGS. 1I, 2, 3I and 4. As such, design structure 320 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 310 preferably employs and incorporates hardware and/or software modules for synthesizing, translating, or otherwise processing a design/simulation functional equivalent of the components, circuits, devices, or logic structures shown in FIGS. 1I, 2, 3I and 4 to generate a netlist 380 which may contain design structures such as design structure 320. Netlist 380 may comprise, for example, compiled or otherwise processed data structures representing a list of wires, discrete components, logic gates, control circuits, I/O devices, models, etc. that describes the connections to other elements and circuits in an integrated circuit design. Netlist 380 may be synthesized using an iterative process in which netlist 380 is resynthesized one or more times depending on design specifications and parameters for the device. As with other design structure types described herein, netlist 380 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 310 may include hardware and software modules for processing a variety of input data structure types including netlist 380. Such data structure types may reside, for example, within library elements 330 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 350, verification data 360, design rules 370, and test data files 385 which may include input test patterns, output test results, and other testing information. Design process 310 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 310 without deviating from the scope and spirit of the invention. Design process 310 may also include modules for performing standard circuit design processes such as timing analysis, verification, design rule checking, place and route operations, etc.

Design process 310 employs and incorporates logic and physical design tools such as HDL compilers and simulation model build tools to process design structure 320 together with some or all of the depicted supporting data structures along with any additional mechanical design or data (if applicable), to generate a second design structure 390 comprising second design data embodied on a storage medium in a data format used for the exchange of layout data of integrated circuits and/or symbolic data format (e.g. information stored in a GDSII (GDS2), GL1, OASIS, map files, or any other suitable format for storing such design structures). In one embodiment, the second design data resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 320, design structure 390 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1I, 2, 3I and 4. In one embodiment, design structure 390 may comprise a compiled, executable HDL simulation model that functionally simulates the devices shown in FIGS. 1I, 2, 3I and 4.

Design structure 390 may also employ a data format used for the exchange of layout data of integrated circuits and/or symbolic data format (e.g. information stored in a GDSII (GDS2), GL1, OASIS, map files, or any other suitable format for storing such design data structures). Design structure 390 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1I, 2, 3I and 4. Design structure 390 may then proceed to a stage 395 where, for example, design structure 390: proceeds to tape-out, is released to manufacturing, is released to a mask house, is sent to another design house, is sent back to the customer, etc.

Thus, the embodiments of the present invention provide fabrication method of silicide layers and method of fabricating devices using silicide layers in the wiring layers of integrated circuits and the devices themselves.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A method, comprising:
   (a) forming a first dielectric layer on a substrate;
   (b) forming a dielectric first capping layer on a top surface of said first dielectric layer;
   (c) forming a silicon-rich layer on a top surface of said first capping layer;
   (d) forming a dielectric second capping layer on a top surface of said silicon-rich layer;
   (e) forming a second dielectric layer over said second capping layer;
   (f) forming a trench through said second dielectric layer and said second capping layer, a region of said top surface of said silicon-rich layer exposed in a bottom of said trench;
   (g) forming a metal layer on said top surface of said second dielectric layer, said metal layer completely filling said trench; and
   after (g), (h) converting said silicon-rich layer to an electrically conductive metal silicide layer by heating said metal layer and silicon rich layer to a temperature greater than room temperature to diffuse metal atoms from said metal layer into said silicon-rich layer.

2. The method of claim 1, further including:
   between (d) and (e), removing regions of said silicon-rich layer and said second capping layer to form a block comprising a remaining region of said silicon-rich layer and a remaining region of said second capping layer.

3. The method of claim 2, further including:
   after forming said block and before (e), forming a dielectric third capping layer on regions of said top surface of said first capping layer not covered by said block and exposed surfaces of said block; and
   wherein (f) includes forming said trench through said third capping layer.

4. The method of claim 1, further including:
   after (h), removing said metal layer from said top surface of said second dielectric layer, a top surface of said metal layer remaining in said trench substantially coplanar with said top surface of said second dielectric layer.

5. The method of claim 1, wherein:
   (f) further includes forming an additional trench through said second dielectric layer and said second capping layer, an additional region of said top surface of said silicon-rich layer exposed in a bottom of said additional trench; and
   (g) further includes said metal layer completely filling said additional trench.

6. The method of claim 5, further including:
   between (d) and (e), removing regions of said silicon-rich layer and said second capping layer to form a block comprising a remaining region of said silicon-rich layer and a remaining region of said second capping layer.

7. The method of claim 1, further including:
   between (a) and (b), forming an electrically conductive wire in said first dielectric layer, a top surface of said wire substantially coplanar with said top surface of said first dielectric layer; and
   after (b) said first capping layer abuts said top surface of said wire.

8. The method of claim 7, further including:
   between (d) and (e), removing regions of said silicon-rich layer and said second capping layer to form a block comprising a remaining region of said silicon-rich layer and a remaining region of said second capping layer and
   after forming said block, said first capping layer intervenes between a region of said wire and a region of said block.

9. The method of claim 1, wherein said silicon-rich layer comprises (1) polysilicon or (2) silicon rich silicon nitride containing at least 48 atom % silicon.

10. The method of claim 1, wherein said metal layer comprises copper or aluminum.

* * * * *